United States Patent
Ott

(10) Patent No.: US 6,674,387 B1
(45) Date of Patent: Jan. 6, 2004

(54) PULSE WIDTH MODULATION ANALOG TO DIGITAL CONVERSION

(75) Inventor: William E. Ott, Phoenix, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/263,931

(22) Filed: Oct. 2, 2002

(51) Int. Cl.[7] ................................................ H03M 1/12
(52) U.S. Cl. ...................................................... 341/155
(58) Field of Search ................................ 341/155, 143, 341/172, 120

(56) References Cited

U.S. PATENT DOCUMENTS 5,229,772 A * 7/1993 Hanlon ........................ 341/172
5,245,343 A    9/1993 Greenwood et al.

* cited by examiner

Primary Examiner—Brian Young
Assistant Examiner—Joseph Lauture

(57) ABSTRACT

A method and apparatus for analog-to-digital conversion is provided that uses pulse width modulation to provide accurate and reliable conversion of analog signals. The methods and apparatus can be implemented in an analog-to-digital converter (ADC) that can meet the requirements of the most demanding environments. Additionally, the ADC can be implemented to provide the high precision needed for many applications. The method and apparatus provides an ADC that converts a received analog input into a pulse width modulated signal with a duty cycle that is responsive to the analog input. The pulse width modulated signal is passed to a duty cycle mechanism that determines the duty cycle of the pulse width modulated signal. The determined duty cycle can then be used to generate a digital value that is proportional to the analog input. The preferred method and apparatus thus provide a reliable and accurate ADC that can be used in a wide range of environments.

17 Claims, 4 Drawing Sheets

PULSE WIDTH MODULATION ANALOG TO DIGITAL CONVERSION

BACKGROUND OF THE INVENTION

1. Technical Field

This invention generally relates to electronic systems, and more specifically relates to analog-to-digital conversion.

2. Background Art

Modem life is becoming more dependent upon electronic systems. Electronics devices have evolved into extremely sophisticated devices, and may be found in many different applications. As electronics become more integrated into daily life, their reliability and accuracy becomes a greater and greater necessity.

One particular type of electronic component in which reliability and accuracy are of increasing importance is in analog-to-digital converters (ADC). ADCs are devices that receive an analog signal, and convert the received analog signal into a digital value that is in some way proportional to the analog signals. As digital computing devices have become more and more common, the need for accurate and reliable ADC devices is increasing.

Presently available ADC devices rely on complex circuitry and may not be robust enough or accurate enough for demanding applications. For example, in applications used in space craft, it is difficult to find ADC devices that have enough precision while also being radiation hardened for use in space.

Thus, what is needed is an improved apparatus and method for converting analog signals to digital signals that can meet the high reliability and precision requirements of modem systems.

DISCLOSURE OF INVENTION

The present invention provides a method and apparatus for analog-to-digital conversion that uses pulse width modulation to provide accurate and reliable conversion of analog signals. The methods and apparatus can be implemented in an analog-to-digital converter (ADC) that can meet the requirements of the most demanding environments. Additionally, the ADC can be implemented to provide the high precision needed for many applications.

The method and apparatus provides an ADC that converts a received analog input into a pulse width modulated signal with a duty cycle that is responsive to the analog input. The pulse width modulated signal is passed to a duty cycle mechanism that determines the duty cycle of the pulse width modulated signal. The determined duty cycle can then be used to generate a digital value that is proportional to the analog input. The preferred method and apparatus thus provide a reliable and accurate ADC that can be used in a wide range of environments.

The foregoing and other objects, features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

The present invention provides a method and apparatus for analog-to-digital conversion that uses pulse width modulation to provide accurate and reliable conversion of analog signals. The methods and apparatus can be implemented in an analog-to-digital converter (ADC) that can meet the requirements of the most demanding environments. Additionally, the ADC can be implemented to provide the high precision needed for many applications.

The method and apparatus provides an ADC that converts a received analog input into a pulse width modulated signal with a duty cycle that is responsive to the analog input. The pulse width modulated signal is passed to a duty cycle mechanism that determines the duty cycle of the pulse width modulated signal. The determined duty cycle can then be used to generate a digital value that is proportional to the analog input. The preferred method and apparatus thus provide a reliable and accurate ADC that can be used in a wide range of environments.

Figure 1:
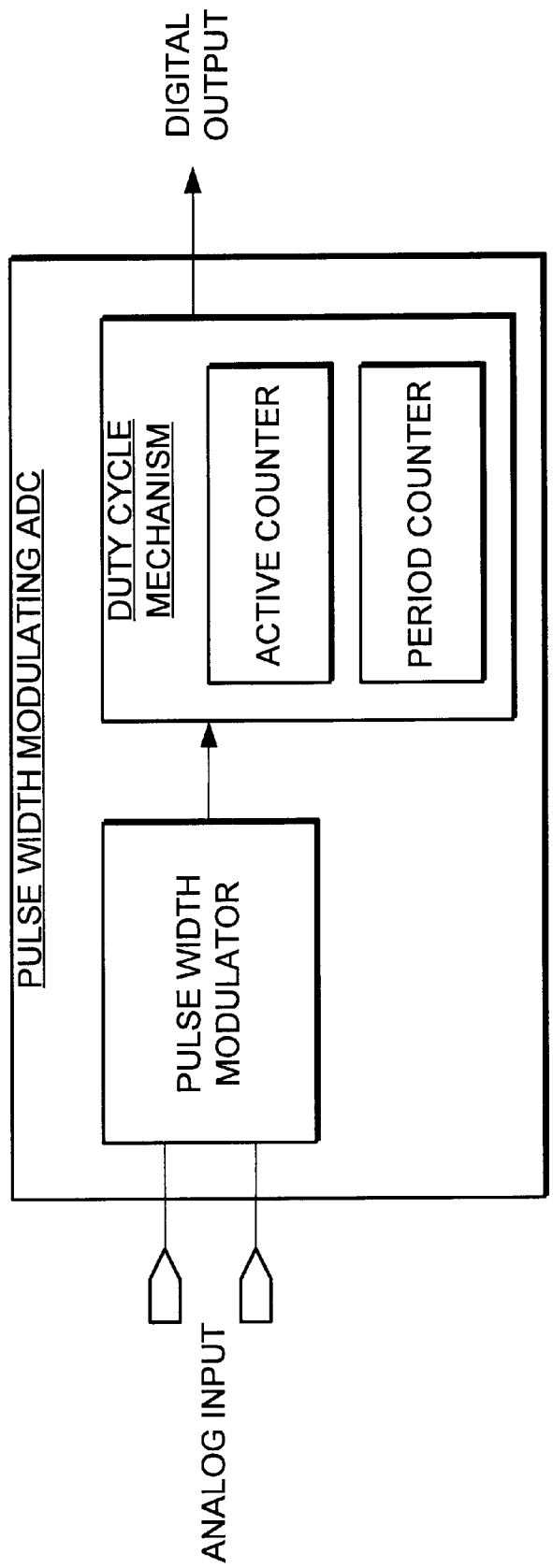
FIG. 1 is a schematic view of a pulse width modulating analog-to-digital converter in accordance with the preferred embodiment.

Turning now to FIG. 1, a schematic view of a preferred embodiment pulse-width-modulating ADC 100. The pulse-width-modulating ADC 100 receives an analog input and passes it to a pulse width modulator. The pulse width modulator converts the analog input into a pulse width modulated signal that is responsive to the analog input. The pulse width modulated signal is passed to a duty cycle mechanism that determines the duty cycle of the pulse width modulated signal and outputs a digital value in proportion to the analog input signal. In the illustrated embodiment, the duty cycle mechanism includes an active counter and a period counter. The active counter measures the time portion that the pulse width modulated signal is enabled. The period counter determines the period of the pulse width modulated signal. The duty cycle of the pulse width modulated signal is determined from the ratio of the enabled time and the period time. From the determined duty cycle, the duty cycle mechanism generates a digital output that is proportional to the original analog input signal.

Figure 2:
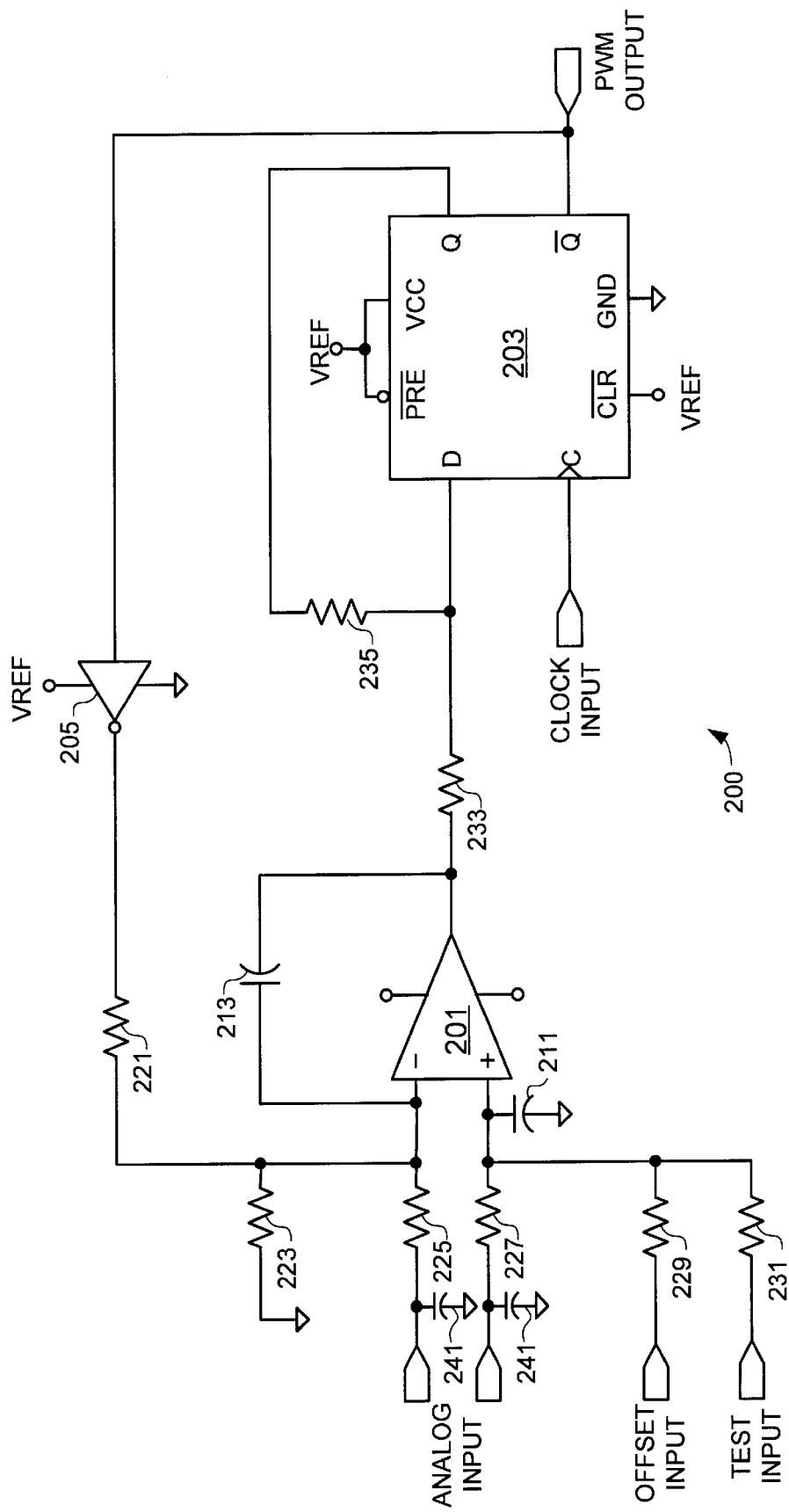
FIG. 2 is a schematic view of a pulse width modulator in accordance with a preferred embodiment.

Turning now to FIG. 2, a schematic view of a pulse width modulator 200 is illustrated. The pulse width modulator 200 is exemplary of the type of modulators that can be used in the pulse-width-modulating ADC 100. The pulse width modulator 200 receives an analog input signal and outputs a pulse width modulated signal with a pulse width that is responsive to the analog input signal. The pulse width modulator 200 includes an operational amplifier 201, a flip-flop 203, an inverter 205, capacitors 211 and 213, and resistors 221, 223, 225, 227, 229,231, 233 and 235. The pulse width modulator 200 also receives an offset input, a test input and a clock input. A first feedback path from an output of flip-flop 203 is fed back through inverter 205 and resistor 221 to the input of the op-amp 201. A second feedback path from an output of flip-flop 203 is fed back through resistor 235 to the D input of flip 203. As an example configuration, capacitors 211 and 213 can comprise 220 picofarads. Resistors 221, 225, 227 and 231 can comprise 500 k ohms. Resistors 223 and 229 can comprise 250 k ohms. Resistor 235 can comprise 50 k ohms, and resistor 233 can comprise 10 k ohms.

The analog input receives the analog signal that is going to be converted to a digital value. The analog input is designed to receive an input signal composed of a differential signal with a common mode voltage, or instead it can simply receive a single ended input signal with the other input tied to ground.

The offset input allows an offset voltage to be injected into the operational amplifier input. This offset voltage is provided to prevent the total input voltage from ever going to zero volts, which would otherwise potentially result in an infinite or constant duty cycle output. The value of the offset voltage input would depend upon the range of voltages that are to be received at the analog input. For example, if the analog input is designed to receive between 0.0 and 4.5 V, then an appropriate offset voltage could be 150 mV. In a case where the analog input is designed to receive negative voltage inputs, the offset would generally be selected to be sufficient to move the analog input into the positive range.

The test input allows a test signal to be inputted into the pulse width modulator 200 to be used in determining if the pulse width modulating ADC is operating correctly. During normal operation, the test signal is disabled, providing essentially zero volts, and the ADC operates normally. During testing, the test signal is enabled and changes the output of the ADC in a defined way. This change can be monitored to determine if the ADC is operating correctly. If the digital output does not change correctly, then the ADC is known not to be operating correctly. The test signal is preferably a pulse train signal that has a controlled duty cycle. By evaluating the pulse width modulator 200 output with different test signals having different duty cycles, the operation of the pulse width modulator 200 can be fully evaluated. A suitable test signal can be produced using a counter operating with the same clock input as flip-flop 203 and injected at the test input using an inverter of the same type as inverter 205. The test signal could also be a dc voltage level, which is disabled during normal operation and provides essentially zero volts, but can be enabled during test to provide a known change in the output duty cycle.

The clock input provides a clock signal that controls the output and feedback timing from flip-flop 203. The clock rate would depend upon the resolution needed by the pulse width modulator 100, with greater clock rates generally resulting in greater resolution. In one exemplary embodiment, the clock input can comprise a 32 MHz clock.

The pulse width modulator 200 uses the flip-flop 203 as a comparator to produce a nonlinear feedback which results in the pulse width modulated signal. As will be explained in detail later, other comparator devices could also be used, such as a logic inverter. In general, the comparator output transitions in response to the operational amplifier output. The transitioned output is fed back to the op-amp input 201 and causes a second transitioning in the comparator output. The first and second transitioning in the comparator output create a pulse-width modulated signal having a duty cycle responsive to the analog signal.

In the implementation illustrated in FIG. 1, the comparator comprises the flip-flop 203. The op-amp 201 receives the analog signal and outputs a signal to the D input of the flip-flop 203. The flip-flop 203 output transitions states on clock edges after the op-amp 201 output causes the D input to cross its threshold voltage. The inverted output Q-bar is fed back through inverter 205 and resistor 221. The inverter 205 is powered off a reference voltage VREF and provides a precision amplitude feedback, which is either zero voltage or the reference voltage, depending on the voltage of its input. The output Q is fed back through resistor 235 and provides hysteresis to the switching of flip-flop 203.

The pulse width modulator 200 also includes input capacitors 241 to provide ESD protection. The input resistors 225 and 227 provides a high input impedance and the duty cycle of the PWM signal is inversely proportional to the ratio of resistors 225 and 227 to the feedback resistor 221. Resistors 223, 229 and 231, in conjunction with resistors 225, 227 and 221, eliminate the common-mode component of the analog input signal if they have the appropriate values, such as the exemplary set of values provided in paragraph 0018. The capacitors 211 and 213 insure that the "saw tooth" waveform at the output of the op-amp 201 does not exceed the op-amp slew rate.

The resistors 233 and 235 at the input to flip-flop 203 are provided to establish a hysteresis level. In conjunction with capacitor 213 and resistor 221, resistors 233 and 235 also control the frequency of the PWM signal. Specifically, a feedback path from the Q output of flip-flop 203 through resistor 235 is provided to give a controlled hysteresis and limit high frequency signals. When the output of op-amp 201 is at a low level resulting in the Q output of the flip-flop 203 being at a low level, resistors 233 and 235 form a voltage divider and the output of op-amp 201 has to increase to a level VH before the flip-flop input is detected as logic high, where $$VH = \frac{(R1+R2)*VTH}{R2}$$

(and where R1 equals the resistance of resistor 233, R2 equals the resistance of resistor 235, and VTH is the D input threshold voltage). After the op-amp 201 output exceeds this value, the next rising edge of the clock results in the outputs Q and Q-bar changing states, with Q going to logic high and Q-bar going to logic low. The positive feedback provided through resistor 235 pulls the D input up, while the main feedback of Q-bar through inverter 205 causes the output of op-amp 201 to ramp down. Capacitor 213 controls the rate of change in the op-amp 201 output. As the op-amp 201 output ramps down, resistor 235 is pulled up to VREF, and the D input voltage is higher than the op-amp 201 output voltage. Resistor 235 now forces the op-amp 201 output to ramp down to a level VL, where $$VL = \frac{(R2-R1)*VTH}{R2}.$$

After the op-amp 201 is less than this value, the next rising edge of the clock results in the flip-flop 203 outputs changing, with the Q output going low. Now positive feedback provided by resistor 235 pulls the D input down. In this manner, resistors 233 and 235 provide hysteresis which, in conjunction with capacitor 213 and resistor 221 controls the frequency of the PWM signal, and also insures that the D input voltage is not at its threshold level all the time.

The resistor 233 also limits current from the op-amp 203 output during power up when the op-amp 203 is initially saturated.

For purposes of explanation of analog to PWM conversion, consider the case of the inverter 205 output at logic high, VREF. This condition results in excessive feedback through resistor 221 causing the output of op-amp 201 to be driven low. When the voltage at the D input of flip-flop 203 is driven to less than the threshold amount, the next clock cycle will cause the Q-bar output to go high. This high signal is fed back through inverter 205 and resistor 221 to the negative input of the op-amp 201. The resulting low signal at the negative input causes the output of the op-amp 201 to go high. When the voltage at the D input of flip-flop 203 is driven higher than the threshold amount, the next clock cycle will cause the Q-bar output to go low. This process continues, and results in an output signal Q-bar with a duty cycle that is proportional to the analog input. Feedback from the op-amp 201 output through the flip-flop 203 causes the average voltage at the output of inverter 205 to be proportional to the analog input voltage. The duty cycle of the PWM signal is thus proportional to the average voltage at the output of inverter 205.

It should be understood that many variations can be made to the pulse width modulator 100. For example, the Q output of flip-flop 403 could, instead of Q-bar, be fed back to operational amplifier 201, eliminating the need for inverter 205. This implementation would have the advantage of simplicity, but would likely result in a small degradation in accuracy. Also, in some cases it would be desirable to use the Q output as the PWM signal instead of the Q-bar output. This would primarily depend on whether additional inversions occur in the duty cycle mechanism that may need to be accounted for.

Figure 3:
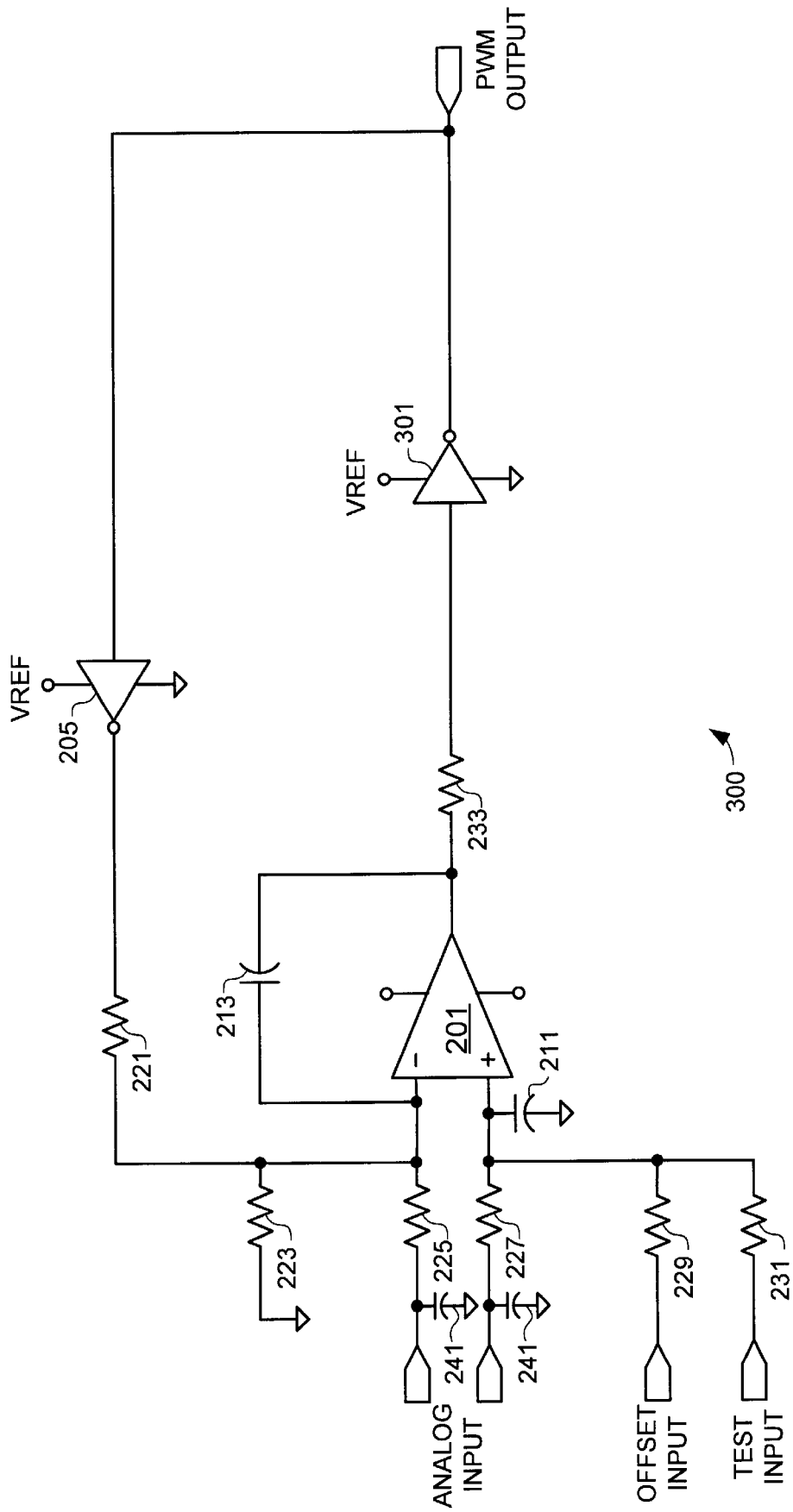
FIG. 3 is a schematic view of a pulse width modulator in accordance with a second embodiment.

As stated above, the pulse width modulator 200 could be implemented with other comparators rather than the flip-flop 203. For example, turning to FIG. 3, a second pulse width modulator 300 is illustrated that uses an inverter 301 as a comparator. This embodiment would have the advantage of device simplicity, but would generally have the disadvantage of lower accuracy and repeatability of the hysteresis, which controls the frequency and repeatability of the PWM signal.

Figure 4:
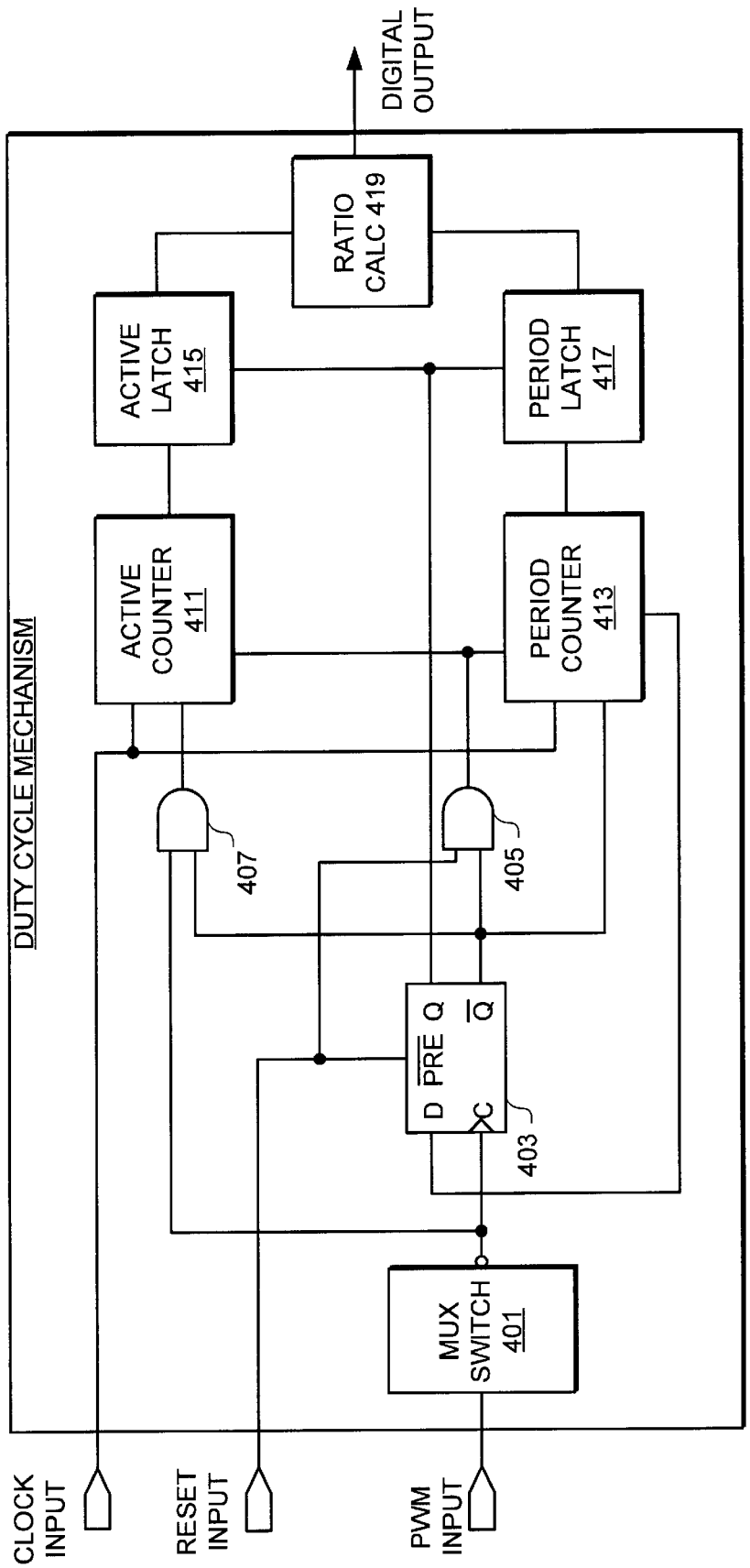
FIG. 4 is a schematic view of a duty cycle mechanism.

Turning now to FIG. 4, a duty cycle mechanism 400 is illustrated schematically. The duty cycle mechanism 400 is an example of the type of mechanism that can be used in the pulse-width-modulating ADC of FIG. 1. As will be described in greater detail later, other devices, such as programmed FPGA devices can be used to implement a duty cycle mechanism. The duty cycle mechanism 400 determines the duty cycle of the pulse width modulated signal and outputs two digital values. One digital value is proportional to the period of the PWM signal, and the other digital value is proportional to the time the PWM signal is active. In the illustrated embodiment, the PWM signal is "active" when it is at logic low, in other implementations the PWM signal could be "active" when it is at logic high. The ratio of these two values is proportional to the analog input signal. In the illustrated embodiment, the duty cycle mechanism includes an inverting mux switch 401, a flip-flop 403, AND gates 405 and 407, an active counter 411, a period counter 413, an active latch 415, a period latch 417 and a ratio calculator 419.

The reset input allows the duty cycle mechanism to be reset at start up and other appropriate times, clearing any partially completed PWM to digital conversions. For the illustrated embodiment, the reset input at logic low causes the duty cycle mechanism to be cleared, the logic high state is the normal state allowing PWM to digital conversion to proceed.

The inverting mux switch 401 allows different PWM input signals to be passed into the duty cycle mechanism 400. Thus, a single duty cycle mechanism 400 can be coupled to and receive PWM input signals from a plurality of pulse width modulators. The inverting mux switch 401 allows a selected one of the plurality of PWM input signals (not shown in FIG. 4) to be passed to the duty cycle mechanism and converted to a digital value.

The selected PWM input signal is outputted by the inverting mix switch 401 and passed to flip-flop 403 and AND gate 407. The Q-bar output of flip-flop 403 enables the period counter 413 when at logic high. The AND gate 407 will enable the active counter 411 when the PWM input is logic low and the period counter 413 is enabled. Either the reset input or the flip-flop 403 Q-bar output going to logic low results in AND gate 405 output clearing both the active counter and the period counter. For purposes of explanation, starting with the counters in the cleared state, the output of the period counter 413 fed back to the D input of flip-flop 403 is a logic low. With the D input of the flip-flop 403 at logic low, the next rising edge of the inverted PWM signal passed to the flip-flop 403 will cause the flip-flop 403 Q-bar output to be at logic high state, which in turn enables the period counter 413 to count provided the reset input is logic high, not in reset state. The period counter 413 counts clock input pulses and when a predetermined count is reached the output fed back to the D input of flip-flop 403 switches to logic high. The next rising edge of the inverted PWM input will cause flip-flop 403 Q-bar output to switch to logic low, disabling both the active counter and period counter. At the same time, flip-flop 403 Q output switches to logic high, latching the active latch 415 and period latch 417 outputs at the logic value at their respective inputs. The period counter 413 output, and subsequently the period latch 417 output, will be the number of clock input pulses which occurred while the period counter 413 was enabled. The feedback to the flip-flop 403 D input insures this is for full periods of the PWM signal since counting started at a rising edge of the inverted PWM input and continued until the next rising edge of the inverted PWM input which occurs after a predetermine number of clock input pulses had been counted. The active counter 407 output, and subsequently the active latch 415 output, will be the number of clock input pulses which occurred while both the inverted PWM input was logic high and the period counter was enabled. The active latch 415 output and the period latch 417 output are passed to the ratio calculator 419. The ratio calculator 419 determines the ratio of the digital value at the output of the active latch 415 to the digital value at the output of the period latch 417 and is the duty cycle of the PWM input signal, which is proportional to the analog input signal. Also, when flip-flop 403 Q-bar output switched to logic low, the AND gate 405 output switched to logic low, clearing both the active counter and period counter. Both counters are in the cleared state, and again ready to start counting at the next rising edge of the inverting mux 401 output.

The clock input provides a pulse train that is counted by the active counter 411 and the period counter 413. In particular, the active counter 411 counts the clock cycles that occur during time periods when the PWM signal is enabled. The period counter 413 likewise counts the clock cycles that occur during one or more periods of the PWM signal. The resulting counts are latched by the active latch 415 and the period latch 417. The latched values can be divided to determine the duty cycle of the PWM and generate a digital value that is proportional to the analog input.

The active counter 411 and period counter 413 can be implemented using any suitable counting devices. For example, they can be implemented using a string of discrete counters. Four 4-bit counters configured in series can provide a $2^{15}$ resolution. The active latch 415 and period latch 417 could likewise be implemented using a string of latches. Two eight bit latches for each device can latch 16 bits of output from each counter. In this implementation the active counter 411 and active latch 415 provide the ability to count and store the active time periods of the PWM signal. Likewise, the period counter 413 and period latch 417 can count and store the period of the PWM signal to a $2^{15}$ resolution. The ratio of these high resolution values provides an accurate measure of the PWM duty cycle, and thus provides an accurate analog-to-digital conversion of the analog input signal.

The ratio calculator 419 can be implemented with any suitable calculating device. For example, the ratio can be performed in hardware, using an FPGA. As another example, when the pulse width modulating ADC is part of a system that includes a microprocessor or other computing device, the ratio calculation could be performed using software. It should be noted that in some embodiments the ratio calculator 419 could be eliminated as the active latch 415 output and the period latch 417 output are themselves digital values that can be used to represent the analog input signal voltage.

As stated above, this is just one example of how the duty cycle mechanism could be implemented. As another example, the duty cycle mechanism could be implemented using a field programmable gate array (FPGA) using standard device design techniques. In this embodiment, the same FPGA used to implement the ratio calculator 419 could also be used to implement the rest of the duty cycle mechanism.

The present invention thus provides a method and apparatus for analog-to-digital conversion that uses pulse width modulation to provide accurate and reliable conversion of analog signals. The methods and apparatus can be implemented in an analog-to-digital converter (ADC) that can meet the requirements of the most demanding environments. Additionally, the ADC can be implemented to provide the high precision needed for many applications.

The embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit of the forthcoming claims.

What is claimed is:

1. An analog-to-digital converter comprising:
   a) a pulse width modulator, the pulse width modulator receiving an analog signal and outputting a pulse-width-modulated signal having a duty cycle responsive to the analog signal, wherein the pulse width modulator includes a comparator having an input and an output and includes an operational amplifier having a first input, a second input, and an output, wherein the operational amplifier output is coupled to the comparator input and wherein the comparator output is fed back to the operational amplifier first input, and wherein the comparator comprises an inverter; and
   b) a duty cycle mechanism, the duty cycle mechanism receiving the pulse-width-modulated signal and determining a digital value proportional to the analog signal from the duty cycle of the pulse-width-modulated signal.

2. The analog-to-digital converter of claim 1 wherein the inverter provides hysteresis in the comparator.

3. An analog-to-digital converter comprising:
   a) a pulse width modulator, the pulse width modulator receiving an analog signal and outputting a pulse-width-modulated signal having a duty cycle responsive to the analog signal, wherein the pulse width modulator includes a comparator having an input and an output and includes an operational amplifier having a first input, a second input, and an output, wherein the operational amplifier output is coupled to the comparator input and wherein the comparator output is fed back to the operational amplifier first input, and wherein the comparator output is fed back to the operational amplifier input through a first inverter; and
   b) a duty cycle mechanism, the duty cycle mechanism receiving the pulse-width-modulated signal and determining a digital value proportional to the analog signal from the duty cycle of the pulse-width-modulated signal.

4. The analog-to-digital converter of claim 3 wherein the comparator comprises a flip-flop.

5. The analog-to-digital converter of claim 3 wherein the comparator output is further fed back to the comparator input with a feedback path.

6. An analog-to-digital converter comprising:
   a) a pulse width modulator, the pulse width modulator receiving an analog signal and outputting a pulse-width-modulated signal having a duty cycle responsive to the analog signal, wherein the pulse width modulator includes a comparator having an input and an output and includes an operational amplifier having a first input, a second input, and an output, wherein the operational amplifier output is coupled to the comparator input and wherein the comparator output is fed back to the operational amplifier first input, and wherein the comparator output is further fed back to the comparator input with a feedback path, and further comprising a first resistor coupled between the op-amp output and the comparator input, and further comprising a second resistor in the feedback path coupled between the comparator output and the comparator input, and wherein the first and second resistors are selected to provide hysteresis in the comparator output; and
   b) a duty cycle mechanism, the duty cycle mechanism receiving the pulse-width-modulated signal and determining a digital value proportional to the analog signal from the duty cycle of the pulse-width-modulated signal.

7. An analog-to-digital converter comprising:
   a) a pulse width modulator, the pulse width modulator receiving an analog signal and outputting a pulse-width-modulated signal having a duty cycle responsive to the analog signal; and
   b) a duty cycle mechanism, the duty cycle mechanism receiving the pulse-width-modulated signal and determining a digital value proportional to the analog signal from the duty cycle of the pulse-width-modulated signal, wherein the duty cycle mechanism includes an active counter to count enabled portions of the pulse-width modulated signal.

8. The analog-to-digital converter of claim 7 wherein the duty cycle mechanism further includes a period counter to count one or more periods of the pulse-width-modulated signal.

9. The analog-to-digital converter of claim 7 wherein the duty cycle mechanism includes a latch to latch the active counter.

10. An analog-to-digital converter comprising:
a) a pulse width modulator, the pulse width modulator receiving an analog signal and outputting a pulse-width-modulated signal having a duty cycle responsive to the analog signal; and
b) a duty cycle mechanism, the duty cycle mechanism receiving the pulse-width-modulated signal and determining a digital value proportional to the analog signal from the duty cycle of the pulse-width-modulated signal, wherein the duty cycle mechanism is implemented in an FPGA.

11. An analog-to-digital converter comprising:
a) a pulse width modulator, the pulse width modulator comprising:
  i) an operational amplifier having a first input, a second input, and an and output, the operational amplifier receiving an analog signal at the first input;
  ii) a comparator having an comparator input and a comparator output; the comparator input receiving the operational amplifier output and the comparator output coupled to the operational amplifier first input, the comparator output transitioning in response to the operational amplifier output, the transitioned comparator output fed back to the operational amplifier first input to cause a second transitioning in the comparator output, the first and second transitioning creating a pulse-width-modulated signal having a duty cycle responsive to the analog signal, wherein the comparator comprises a flip-flop and further comprising a first resistor between the operational amplifier output and the comparator input, and wherein the comparator output is fed back to the comparator input through a second resistor and wherein the first and second resistors create hysteresis in the comparator; and
b) a duty cycle mechanism, the duty cycle mechanism receiving the pulse-width-modulated-signal and determining a digital value proportional to the analog signal from the duty cycle of the pulse-width-modulated signal.

12. An analog-to-digital converter comprising:
a) a pulse width modulator, the pulse width modulator comprising:
  i) an operational amplifier having a first input, a second input, and an and output, the operational amplifier receiving an analog signal at the first input;
  ii) a comparator having an comparator input and a comparator output, the comparator input receiving the operational amplifier output and the comparator output coupled to the operational amplifier first input, the comparator output transitioning in response to the operational amplifier output, the transitioned comparator output fed back to the operational amplifier first input to cause a second transitioning in the comparator output, the first and second transitioning creating a pulse-width-modulated signal having a duty cycle responsive to the analog signal, and further comprising an inverter and a resistor coupled between the comparator output and the first input; and
b) a duty cycle mechanism, the duty cycle mechanism receiving the pulse-width-modulated-signal and determining a digital value proportional to the analog signal from the duty cycle of the pulse-width-modulated signal.

13. The analog-to-digital converter of claim 12 wherein the comparator comprises second inverter.

14. The analog-to-digital converter of claim 13 wherein the second inverter provides hysteresis in the comparator.

15. A method comprising the steps of:
a) receiving an analog input signal, the analog input signal having a voltage;
b) converting the analog input signal into a pulse-width modulated signal having a duty cycle responsive to the analog input signal voltage;
c) determining the duty cycle of the pulse width modulated signal, and wherein the step of determining the duty cycle comprises counting time portions the pulse-width-modulated signal is enabled and counting the period of the pulse-width-modulated signal; and
d) outputting a digital value from the duty cycle, the digital value proportional to the analog input signal voltage.

16. The method of claim 15 wherein the step of determining the duty cycle further comprises computing a ratio of the counted time portions the pulse-width-modulated signal is enabled and the counted period of the pulse-width-modulated signal.

17. The method of claim 15 wherein the step of converting the analog input signal into a pulse-width modulated signal comprises transitioning an output and feeding back the transitioned output to cause a second transitioning, the first and second transitioning creating a pulse-width-modulated signal having a duty cycle responsive to the analog input signal voltage.

* * * * *